United States Patent [19]

Mylroie

[11] 4,143,392

[45] Mar. 6, 1979

[54] COMPOSITE JFET-BIPOLAR STRUCTURE

[75] Inventor: Steve W. Mylroie, Palo Alto, Calif.

[73] Assignee: Signetics Corporation, Sunnyvale, Calif.

[21] Appl. No.: 828,999

[22] Filed: Aug. 30, 1977

[51] Int. Cl.² ............................................. H01L 27/02
[52] U.S. Cl. ........................................ 357/43; 357/22; 357/34; 357/48; 357/52
[58] Field of Search ........................ 357/43, 22, 34, 48, 357/52

[56] References Cited

U.S. PATENT DOCUMENTS

| | | | |
|---|---|---|---|
| 4,048,649 | 9/1977 | Bohn | 357/43 |
| 4,066,917 | 1/1978 | Compton et al. | 357/43 |

*Primary Examiner*—Edward J. Wojciechowicz
*Attorney, Agent, or Firm*—Jerry A. Dinardo; Jack Oisher

[57] ABSTRACT

A junction field effect transistor and a bipolar transistor are merged in a single composite device disposed within a single isolation region by the use of planar processing techniques. The device includes an annular source region formed within a semiconductor body portion constituting a collector zone. Within the central portion of the collector zone circumscribed by the annular source region there is formed an emitter zone nested within a region that constitutes both the drain region of the JFET and the base zone of the bipolar transistor. An annular channel region connects the annular source region and the central drain region. An annular region forming a semiconductor junction with the annular channel adjacent to the annular source region constitutes one of two gate regions of the JFET. The other gate region is constituted by the body portion serving as the collector zone.

14 Claims, 2 Drawing Figures

4,143,392

COMPOSITE JFET-BIPOLAR STRUCTURE

BACKGROUND OF THE INVENTION

This invention relates to a composite semiconductor device having a junction field effect transistor merged with a bipolar transistor and exhibiting high input impedance and high transconductance.

Junction field effect transistors, or JFETS, as they are commonly known, are devices whose output current is controlled by an input voltage. Their characteristically high input impedance, therefore, makes them useful in many analog applications because they do not load signal sources connected to their inputs. One of their major shortcomings, however, is their relatively low transconductance as compared with that of a bipolar transistor.

It has been known to combine a JFET with a bipolar transistor to multiply the effective transconductance, but in the past such bipolar-field effect transistor combination has not found widespread use because of the heretofore incompatible processing requirements of the two devices. Recent developments in analog circuitry fabrication, such as the application of ion implantation, has permitted bipolar and FET fabrication in the same analog circuitry.

This invention carries the above developments one step further by merging a junction field effect transistor with a bipolar transistor in a single composite device within a single isolation region by the use of planar processing techniques.

SUMMARY OF THE INVENTION

A composite bipolar and junction field effect transistor structure includes a semiconductor body portion of first type conductivity in which are formed spaced apart source and drain regions of second type conductivity. The source and drain regions extend from a major surface of the body portion a given depth therein. A channel region of second type conductivity extends between the source and drain regions and also extends from the major surface into the body portion a smaller distance than the given depth of the source and drain regions.

One of the source and drain regions also constitutes the base zone of a bipolar transistor, in which base zone region there is formed an emitter zone of the first type conductivity. The body portion forms the collector zone of the bipolar transistor.

A region of first type conductivity is formed in the channel region and constitutes one of two gate regions of a junction field effect transistor including the source, drain, and channel regions as its component parts. The body portion serving as the collector of the bipolar transistor also constitutes the other gate region of the junction field effect transistor.

DESCRIPTION OF THE PREFERRED EMBODIMENT

Figure 1:
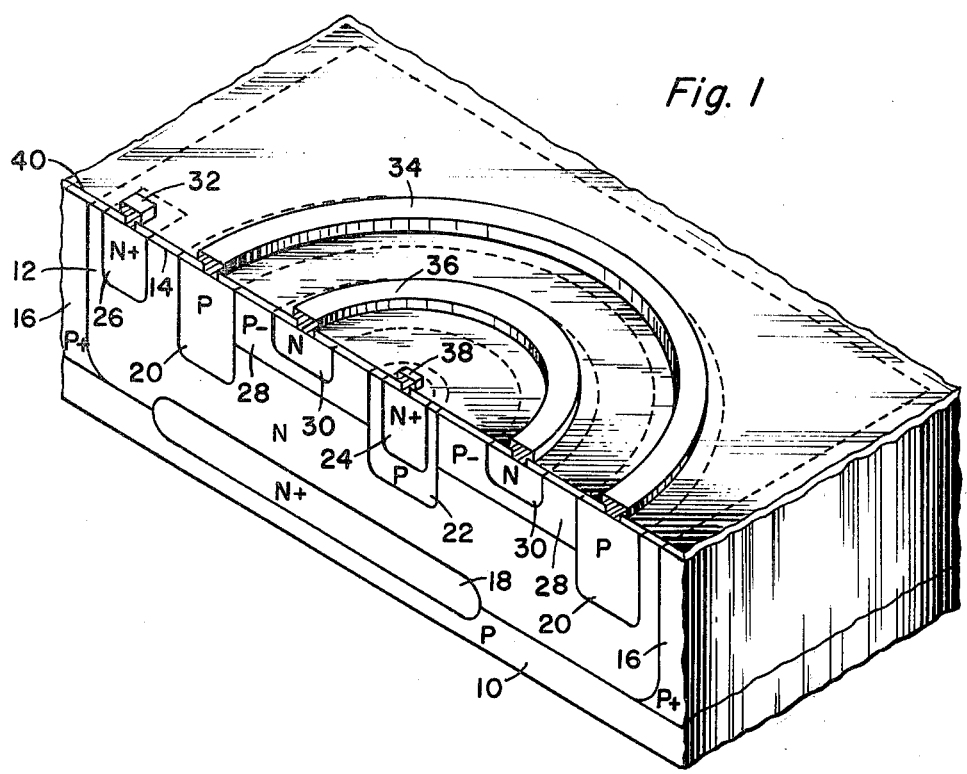
FIG. 1 is an isometric view, partly in section, showing a composite bipolar and junction field effect transistor merged structure according to the invention.

Referring now to FIG. 1, there is shown by way of example an NPN bipolar transistor integrated or merged with a P-channel JFET. It is understood that a PNP transistor and an N-channel JFET can be similarly integrated by reversing the conductivities shown and described. In the isometric view shown, the cross-section is taken diametrically through the circular structure shown. The composite semiconductor device includes a lower semiconductor body portion or substrate 10 of P type silicon upon which an upper semiconductor body portion or epitaxial layer 12 of N type conductivity may be grown. The epitaxial layer 12 has a planar top or major surface 14.

A laterally circumscribing isolation region 16, which may be of the same conductivity type as and higher conductivity than the P type substrate 10, extends from the major surface 14 through the entire depth of the epitaxial layer 12 to pierce the substrate 10. Thus the isolation region 16 may be a P+ region. Alternatively, the isolation region may be of insulating material such as silicon dioxide.

A buried layer 18 of the same type conductivity as and of higher conductivity than the epitaxial layer 12 forms a junction with the substrate 10 and extends laterally a substantial distance within the confines of the isolation region 16, but not in contact with the latter. The buried layer 18 is accordingly labeled N+ to indicate its high conductivity. The buried layer 18 may be formed by diffusing into the substrate 10, prior to growth of the epitaxial layer 12, an appropriate concentration of N type impurity, such as arsenic or antimony, according to well-known practice.

An annular source region 20 of P type conductivity extends from the major surface 14 into the epitaxial layer 12 a substantial portion of the depth of the layer 12 but spaced from the buried layer 18. The annular source region 20 may be formed by diffusing a P type impurity of appropriate concentration, such as boron, into the epitaxial layer 12, forming a PN junction therewith.

A drain region 22 of P type conductivity is located centrally within the portion of the epitaxial layer 12 circumscribed by the annular source region 20. The drain region 22 extends from the major surface 14 into the epitaxial layer about the same depth as the annular source region 20. The drain region 22 may be formed by diffusion at the same time as the formation of the annular source region 20. The drain region 22 also constitutes the base zone of a bipolar transistor, the collector zone of which is constituted by the epitaxial layer 12 which forms a PN junction with the region and zone 22.

An emitter zone 24 of N type conductivity is formed within the drain region 22, forming a PN junction therewith, and extends to the major surface 14. A collector contact zone 26 of N type conductivity is located within a portion of the epitaxial layer 12 lying between the annular source region 20 and the isolation region 16. The collector contact zone 26 thus lies outside the region of the epitaxial layer 12 circumscribed by the annular source region 20. Both N type zones 24 and 26 are of high conductivity, and thus labeled N+, and may be formed by simultaneous diffusion.

The buried layer 18, which serves to reduce the collector series resistance, extends laterally from a region below the collector contact zone 26 to a region below the drain/base region 22.

An annular channel region 28 of P type conductivity extends between the annular source region 20 and drain region 22. The annular channel region 28 is labeled P− as having a lower conductivity than the source and drain regions 20, 22, which are labeled P. The annular channel region 28 overlaps both the source region 20 and the drain region 22 but is spaced from the emitter zone 24. The annular channel region 28 extends from the major surface 14 into the epitaxial layer 12 a shallow distance much smaller than the depth of the source and drain regions 20, 22 and forms a PN junction with the epitaxial layer 12.

An annular top gate region 30 of N type conductivity is located within the channel region 28 forming a PN junction therewith. The annular top gate region 30 is located closer to the annular source region 20 than to the drain region 22.

Both the annular channel region 28 and the top gate region 30 are surface regions extending to the major surface 12 and are preferably formed by ion implantation. The desirable nature of ion implantation is such that the order in which the regions 28 and 30 may be implanted is optional. Thus the channel region 28 may be implanted before or after the top gate region 30 is implanted. The concentration of dopant for the N type top gate may be tailored to the current versus voltage characteristics desired of the junction field effect transistor.

A surface layer of metallization is applied to form a collector contact 32 to the collector contact zone 26, an annular source contact 34 to the annular source region 20, an annular top gate contact 36 to the annular top gate 30 and an emitter contact 38 to the emitter region 24. The contacts 32, 34, 36 and 38 are formed through openings in a surface oxide insulating layer 40.

If desired, a metal region forming a Schottky barrier junction with the channel region 28 could be used in place of the annular top gate region 30 of N type conductivity. In this case, the metal region would serve to provide both the Schottky barrier junction as well as the metal contact for the barrier junction. To provide the Schottky barrier junction, the surface concentration of the channel region 28 should be less than $10^{15}$ atoms per cubic centimeter. A metal such as platinum has been found to make reliable Schottky barrier junction with silicon.

It should be noted that in an N channel device, where the body portion 12 is P type rather than N type, the collector contact 32, if made of aluminum, can be applied directly to the body portion 12 rather than to a high conductivity zone such as collector contact zone 26. In such case a higher conductivity P+ zone is unnecessary.

Figure 2:
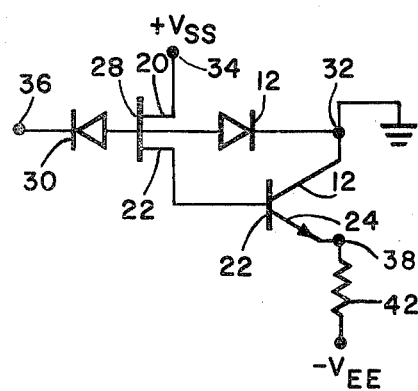
FIG. 2 is a schematic diagram of an equivalent circuit of the structure of FIG. 1.

An equivalent circuit for the composite integrated structure of FIG. 1 is shown in FIG. 2. The same numerals as are used in FIG. 1 are applied to the circuit components to indicate corresponding elements. In FIG. 2, the gate contact 36 is shown as the input terminal of the JFET which also includes the source 20 and source contact 34, drain 22, and channel 28. The top gate region 30 is shown in FIG. 2 as the negative or N side of a diode or rectifying PN junction which the top gate region 30 forms with the channel 28. The positive or P side of the diode or rectifying junction is shown directly connected to the channel 28. The diode or junction is shown with the polarity that is conventional for a P channel JFET. The source contact 34 is shown as a terminal connected to a positive voltage supply $+V_{SS}$.

The other side of the channel 28 is shown coupled through a second diode or PN rectifying junction to the collector 12 of the bipolar transistor which also includes the emitter 24 and base 22. The collector contact 32 is shown as an output terminal connected to ground and the emitter contact 38 is shown as an output terminal connected through a load resistor 42 to a negative voltage supply $-V_{EE}$. The body portion or collector 12 of the bipolar transistor also serves as the bottom gate of the JFET, which bottom gate is shown as the negative or N side 12 of the PN junction it forms with the bottom side of the channel 28.

The base of the bipolar transistor and the drain of the JFET are merged in the same region 22 as indicated previously, although the circuit diagram of FIG. 2 shows them as separate elements 22 conductively connected together to indicate their individual functions in their respective devices.

To illustrate the operation of the circuit of FIG. 2 as an inverter amplifier, let it be assumed that the signal input to the gate terminal 36 is negative. The negative signal will reduce the reverse bias on the gate to channel junction so as to narrow the depletion region in the channel 28, increase the conductivity of the channel 28 and cause a larger current to flow in the JFET from the source 20 to the drain 22. Because the drain 22 is merged with the base 22 of the bipolar transistor, the drain current is forced to flow as base current drive to the bipolar transistor, which increases the current flowing in the emitter circuit. This increased current flow in the emitter circuit causes a voltage drop across the load resistor 40 and drives the output voltage at the terminal 38 less negative, or in a positive direction. Thus a negative input signal will produce a positive output signal, and an inversion has occurred.

Similarly, it can be seen that a positive input signal will increase the reverse bias on the gate to channel junction so as to widen the depletion region in the channel 28 and reduce the source to drain current in the JFET. The base drive to the bipolar transistor is accordingly reduced and the emitter current is reduced, thereby causing the voltage at the output terminal 38 to decrease towards the level of the supply voltage $-V_{EE}$. Since this is a negative voltage, it is apparent that an inversion of the positive input signal has occurred.

Since the source to drain current or channel current of the JFET is forced into the base and provides the input to the bipolar transistor, the channel current is multiplied by the transconductance of the bipolar transistor so that the effective transconductance of the JFET is multiplied by the $G_m$ of the bipolar transistor. Since the input signal is applied to the gate of the JFET, the input impedance is high.

It is noted that no external connection is required to the drain and base 22. The emitter terminal 38 is the effective drain terminal of the JFET.

What is claimed is:

1. A semiconductor device, comprising:
   (a) a semiconductor body portion of first type conductivity and having a major surface;
   (b) an annular first region of second type conductivity opposite said first type conductivity and extending from said major surface into said body portion;
   (c) a second region of said second type conductivity located within a region of said body portion circumscribed by said annular first region and extending to said major surface;
   (d) an annular third region of said second type conductivity extending between said first and second regions and extending from said major surface into said body portion a shallower distance than either of said first and second regions;

(e) a zone of said first type conductivity within said second region and extending to said major surface;

(f) means separated from said first and second regions, surrounding said second region and forming a semiconductor junction with a surface portion of said annular third region; and (g) contact means conductively connected separately to said body portion, said annular first region, said zone, and said semiconductor junction-forming means.

2. The invention according to claim 1, wherein the semiconductor junction of (f) is located closer to said annular first region than to said second region.

3. The invention according to claim 1 and further including a buried region in a lowermost part of said body portion spaced from said first and second regions and of higher conductivity relative thereto, said buried region having a lateral extent which at least substantially encompasses the distance between said second region and the contact means to said body portion.

4. The invention according to claim 1 wherein the contact means conductively connected to said body portion comprises a surface zone in said body portion of higher conductivity relative thereto, and a metal portion forming ohmic contact with said surface zone.

5. The invention according to claim 1 and further including means for applying operating potentials to said contact means whereby said annular first region operates as a source of a JFET, said body portion operates as a collector of a bipolar transistor and a bottom gate of said JFET, said zone operates as an emitter of said bipolar transistor, and said semiconductor junction-forming means operates as a top gate of said JFET.

6. A semiconductor device, comprising:

(a) a semiconductor body portion of first type conductivity and having a major surface;

(b) spaced apart source and drain regions of second type conductivity formed in said body portion and extending from said major surface a given depth within said body portion, an outer one of said regions surrounding an inner one of said regions;

(c) a channel region of said second type conductivity extending the entire distance between said source and drain regions and extending from said major surface into said body portion a smaller distance than said given depth;

(d) means forming an emitter zone of said first type conductivity within one of said source and drain regions, said one region constituting a base zone;

(e) means spaced from said source, drain, and channel regions and forming a collector contact with a portion of the major surface of said semiconductor body portion; and (f) means spaced between said source and drain regions, surrounding the inner one of said regions and forming a semiconductor junction with a surface portion of said channel region so as to constitute a first gate region of a JFET including said source, drain, and channel regions as component parts thereof, with the means in (e) constituting a contact to another gate region of said JFET separate from said first gate region.

7. The invention according to claim 6, wherein said semiconductor body portion has N type conductivity.

8. The invention according to claim 6 and further including isolation means surrounding said device.

9. The invention according to claim 6 wherein said source and drain regions and said emitter zone are formed by diffusion.

10. The invention according to claim 6 wherein said channel region and said gate region are formed by ion implantation.

11. The invention according to claim 1 wherein the means in (f) comprises a semiconductor region of first type conductivity forming a semiconductor junction with said annular third region.

12. The invention according to claim 1 wherein the means in (f) comprises a metal region forming a Schottky barrier junction with said annular third region.

13. The invention according to claim 6 wherein the means in (f) comprises a semiconductor region of first type conductivity forming a semiconductor junction with said channel region.

14. The invention according to claim 6 wherein the means in (f) comprises a metal region forming a Schottky barrier junction with said channel region.

* * * * *